(12) United States Patent
Kuribayashi

(10) Patent No.: US 6,314,074 B1
(45) Date of Patent: Nov. 6, 2001

(54) RECORDING INFORMATION REPRODUCING APPARATUS HAVING CIRCUITS FOR REDUCING RESIDUAL PHASE ERROR

(75) Inventor: Hiroki Kuribayashi, Tsurugashima (JP)

(73) Assignee: Pioneer Electronic Corporation, Tokoya (JP)

( * ) Notice: Subject to any disclaimer, the term of this patent is extended or adjusted under 35 U.S.C. 154(b) by 0 days.

(21) Appl. No.: 09/239,121

(22) Filed: Jan. 28, 1999

(30) Foreign Application Priority Data

Jan. 30, 1998 (JP) .................................................. 10-019011

(51) Int. Cl.$^7$ ....................................................... G11B 7/00
(52) U.S. Cl. ................... 369/124.05; 369/47.35; 369/59.21; 369/47.26
(58) Field of Search ............................. 369/59, 47, 124, 369/48, 54, 44.35, 44.36, 58, 47.26, 124.13, 47.35, 124.01, 124.05, 59.21; 386/2, 20; 348/497

(56) References Cited

U.S. PATENT DOCUMENTS 5,142,377 * 8/1992 Moriyama et al. ...................... 386/2
5,412,638 * 5/1995 Koulopoulos et al. ................ 369/59
5,901,128 * 5/1999 Hayashi et al. ........................ 369/59
5,963,518 * 10/1999 Kobayashi et al. .................... 369/48

* cited by examiner

Primary Examiner—David Hudspeth
Assistant Examiner—Kim-Kwok Chu
(74) Attorney, Agent, or Firm—Perman & Green, LLP

(57) ABSTRACT

A recording information reproducing apparatus which can reduce a residual phase error in a read signal caused due to an influence by a time base fluctuation. A read signal read out from a recording medium is sampled at a timing according to a clock signal, thereby obtaining a read sampling value sequence. An oscillation signal whose phase is synchronized with the read sampling value sequence is formed as a clock signal. A sampling value sequence which is obtained at a time point when the phase in the read sampling value sequence is deviated by an amount corresponding to a phase error occurring in the read sampling value sequence is obtained as a corrected read sampling value sequence. By performing a decoding process to the correction read sampling value sequence, information data is obtained.

13 Claims, 12 Drawing Sheets

RECORDING INFORMATION REPRODUCING APPARATUS HAVING CIRCUITS FOR REDUCING RESIDUAL PHASE ERROR

BACKGROUND OF THE INVENTION

1. Field of the Invention

The present invention relates to a recording information reproducing apparatus for reproducing recording information from a recording medium.

2. Description of Related Art

FIG. 1 is a diagram showing the structure of a conventional recording information reproducing apparatus.

In FIG. 1, a pickup 1 reads recording information from a recording disc 3 which is rotated by a spindle motor 2 and supplies a read signal obtained by the reading to an A/D converter 5. The A/D converter 5 sequentially samples the read signal at a timing of a clock signal supplied from a PLL circuit 10 and supplies a read sampling value sequence obtained by the reading to each of the PLL circuit 10 and a decoding circuit 30.

A phase error detecting circuit 11 in the PLL circuit 10 detects a phase error which develops in the read signal based on the read sampling value sequence sequentially supplied from the A/D converter 5 and supplies a phase error signal corresponding to the amount of the phase error to an LPF (low pass filter) 12. The LPF 12 supplies an average phase error signal obtained by averaging the phase error signals to a frequency variable oscillator 13. The frequency variable osillator 13 generates a clock signal having a frequency according to the average phase error signal and supplies it to the A/D converter 5. The decoding circuit 30 is constituted, for example, by a Vlterbi decoder, and is operative to detect the read sampling value sequence as successive time series and to decode maximum likelihood binary reproduction data based on the detected time series.

In the recording information reproducing apparatus as mentioned above, the clock signal whose phase is synchronized with that of the read signal read from the recording disc 3 is generated by the PLL circuit 10 and the read signal is sampled by the clock signal, thereby obtaining the read sampling value sequence.

If, however, a linear recording density of the information recorded on the recording disc 3 is high, the read signal will be influenced by a rotation variation of the spindle motor 2, an eccentricity of the recording disc 3 itself, or the like and a time base fluctuation will occur in the read signal. In such a case, if the PLL circuit 10 becomes unable to follow the time base fluctuation, a phase deviation develops in the read sampling value sequence generated from the A/D converter 5. Therefore, residual errors may remain in the read sampling value sequence due to the influence of the phase deviation and a problem arises such that the decoding circuit 30 at a later stage cannot perform a very reliable decoding operation.

OBJECT AND SUMMARY OF THE INVENTION

The invention has been made to solve the problem described above, and it is an object of the invention to provide a recording information reproducing apparatus which can reduce a residual phase error in a read signal caused by an influence of a time base fluctuation.

According to the invention, there is provided a recording information reproducing apparatus for reproducing information data corresponding to recording information recorded on a recording medium based on a read signal read out from the recording medium, comprising: a PLL circuit for generating an oscillation signal whose phase is synchronized with that of a read sampling value sequence obtained by sampling the read signal at a timing according to a clock signal and using the oscillation signal as a clock signal; phase correcting means for obtaining a sampling value sequence derived at a time point when the phase in the read sampling value sequence is deviated by an amount corresponding to a phase error which occurs in the read sampling value sequence and supplying the sampling value sequence as a corrected read sampling value sequence; and decoding means for executing a decoding process to the corrected read sampling value sequence, thereby obtaining the information data.

DETAILED DESCRIPTION OF THE PREFERRED EMBODIMENTS

Embodiments of the invention will now be described hereinbelow.

Figure 2:
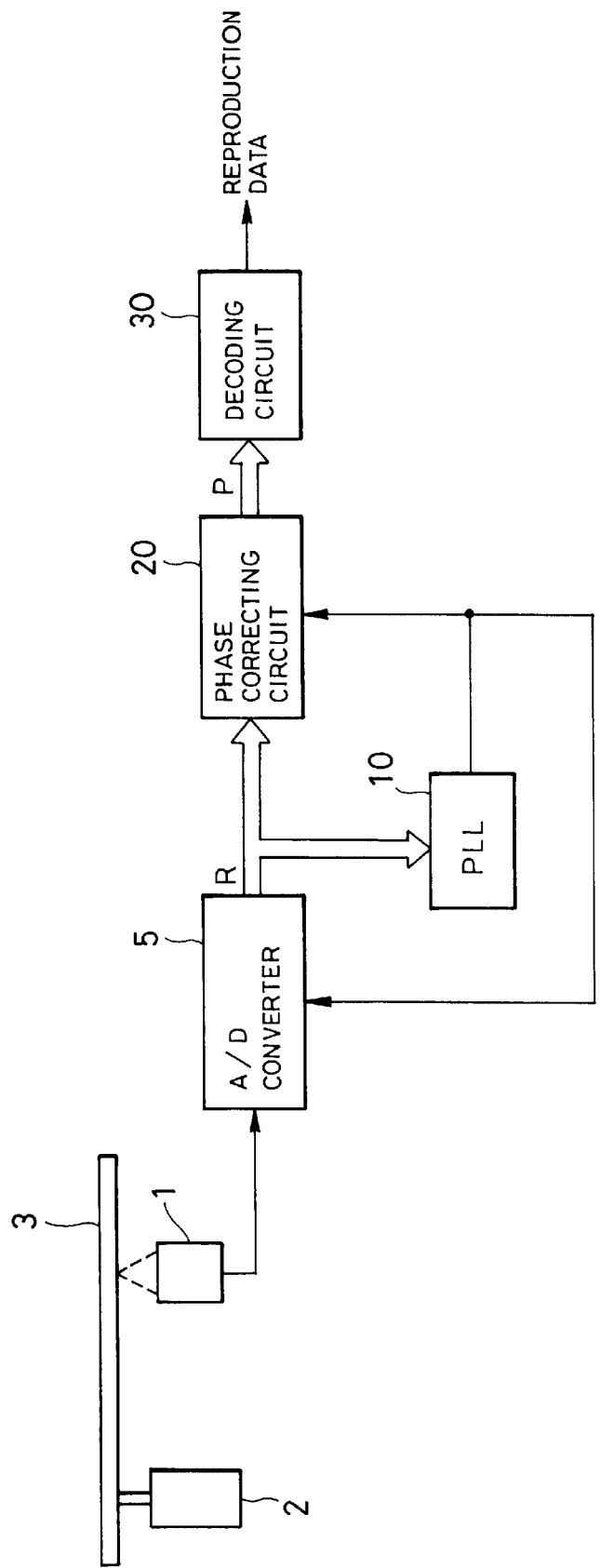
FIG. 2 is a diagram showing the structure of a recording information reproducing apparatus according to the invention.

FIG. 2 is a diagram showing the structure of a recording information reproducing apparatus according to the invention.

Figure 1:
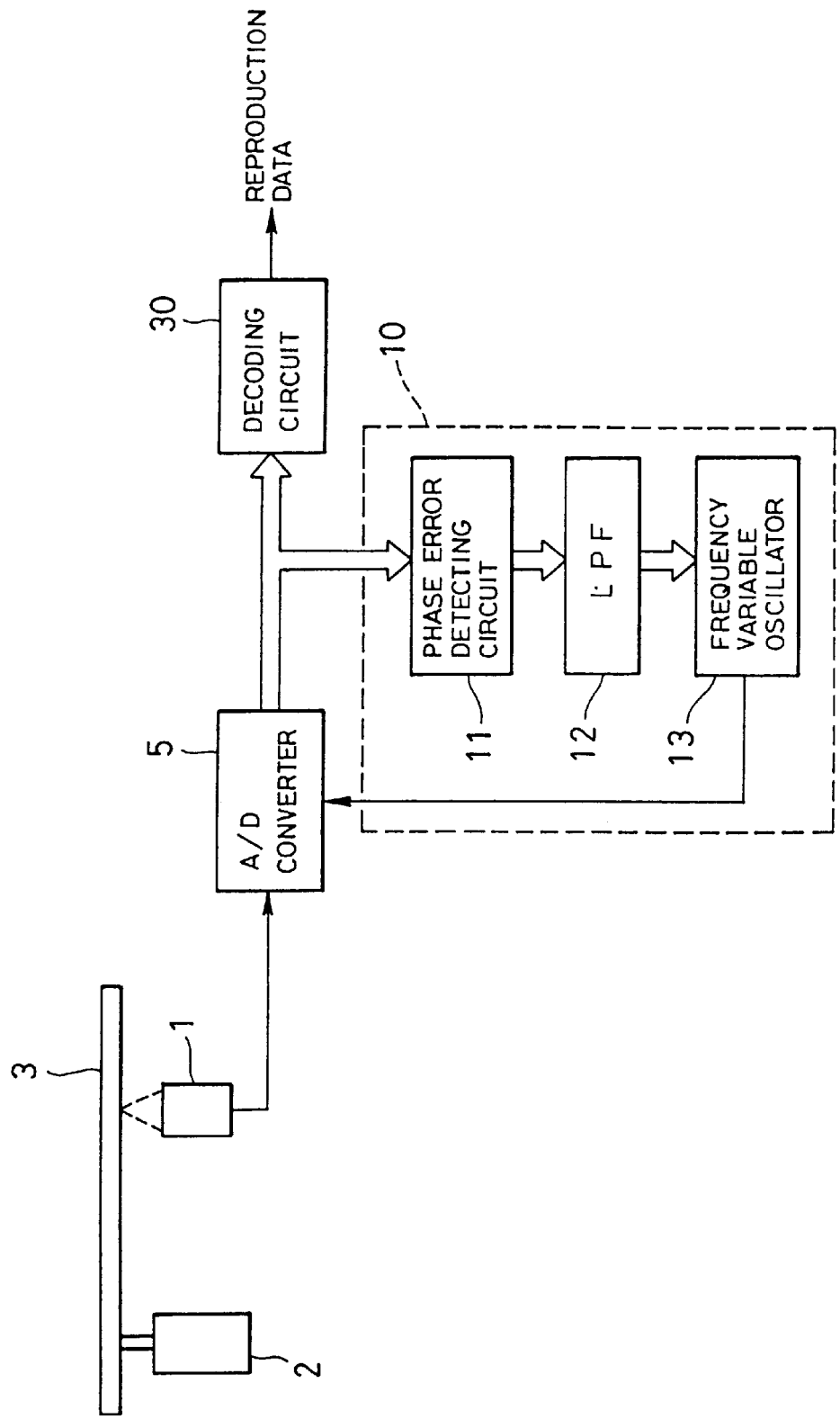
FIG. 1 is a diagram showing the structure of a conventional recording information reproducing apparatus.

In FIG. 2, the pickup 1 reads recording information from recording tracks of the recording disc 3 which is rotated by the spindle motor 2 and supplies a read signal obtained by the reading to the A/D converter 5. The A/D converter 5 sequentially samples the read signal at a timing of a clock signal supplied from the PLL circuit 10 and supplies a read sampling value sequence (R) obtained in this instance to each of the PLL circuit 10 and a phase correcting circuit 20. The PLL circuit 10 detects a phase error which develops in the read signal on the basis of the read sampling value sequence (R) sequentially supplied from the A/D converter 5, generates a clock signal having a frequency corresponding to the phase error, and supplies the clock signal to each of the A/D converter 5 and phase correcting circuit 20. The internal structure of the PLL circuit 10 is the same as that shown in FIG. 1.

The phase correcting circuit 20 detects a phase deviation remaining in the read sampling value sequence (R), obtains a sampling value sequence which is supposed to be obtained at the time point when the phase deviation is corrected in the read sampling value sequence (R), and supplies it as a corrected read sampling value sequence (P) to the decoding circuit 30.

Figure 3:
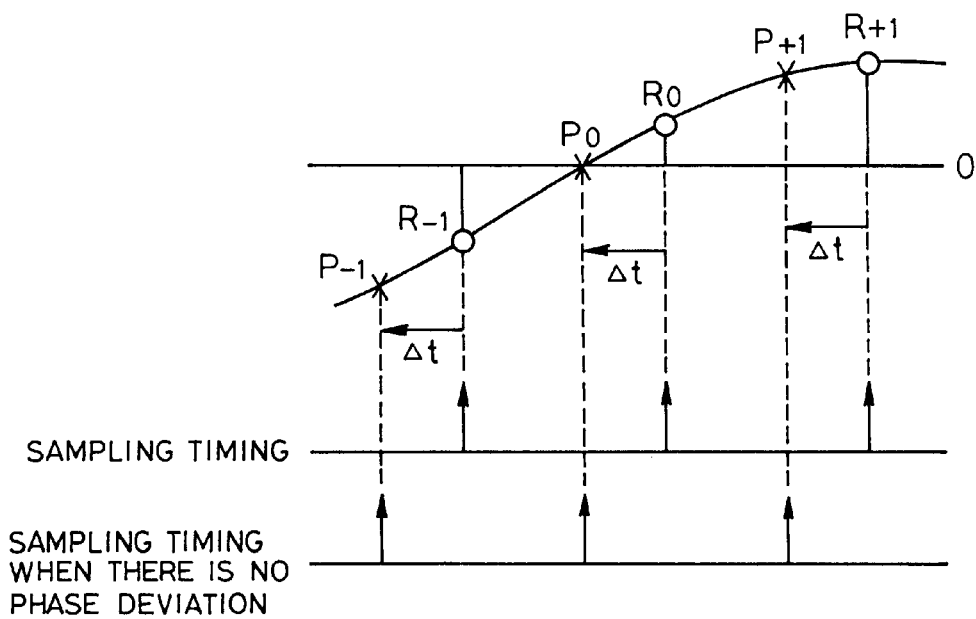
FIGS. 3 and 4 are diagrams for explaining the phase correcting operation by a phase correcting circuit 20.
Figure 4:
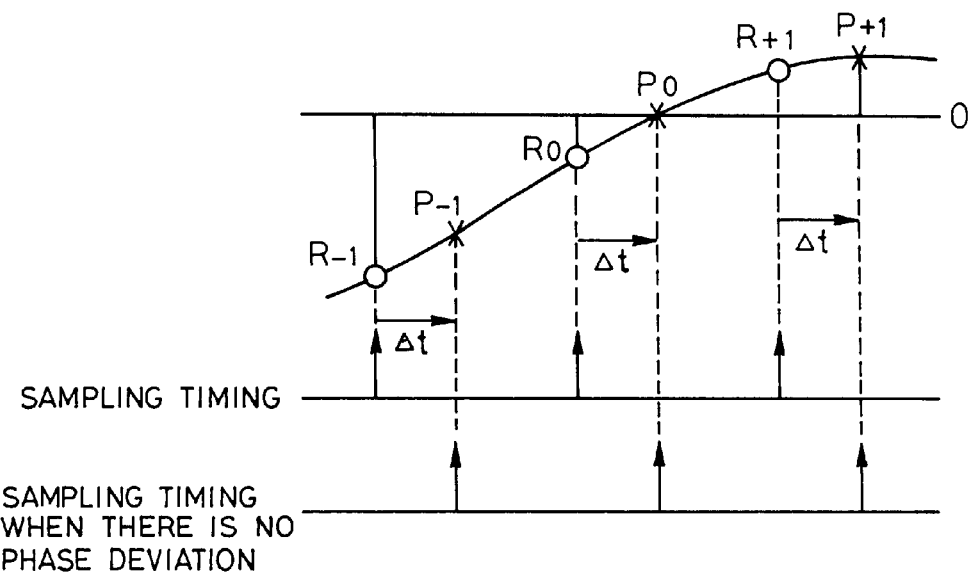

FIGS. 3 and 4 are diagrams showing examples of the phase correcting operation by the phase correcting circuit 20.

An axis of abscissa of each of FIGS. 3 and 4 shows a time sequence which is newer as the position approaches the right side and it is older as the position approaches the left side. Data on the right side in the graph is, consequently, more delayed and data on the left side is more advanced.

As shown in FIG. 3, when a sampling timing is delayed by $\Delta_t$, the corrected read sampling value sequence (P) derived when the sampling timing is advanced by $\Delta_t$ is obtained on the basis of the read sampling value sequence (R).

As shown in FIG. 4, when the sampling timing is advanced by $\Delta_t$, the corrected read sampling value sequence (P) which is derived when the sampling timing is delayed by $\Delta_t$ is obtained on the basis of the read sampling value sequence (R).

In this manner, the phase difference remaining in the read sampling value sequence (P) is corrected.

The decoding circuit 30 is constructed by, for example, a Viterbi decoder and decodes maximum likelihood binary reproduction data on the basis of the corrected read sampling value sequence (P).

Figure 5:
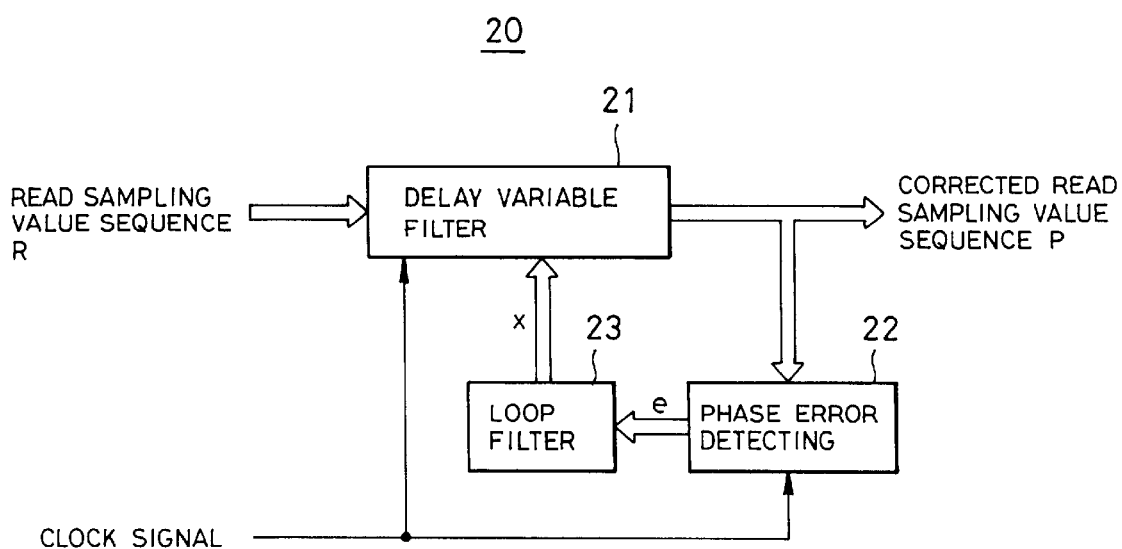
FIG. 5 is a diagram showing an internal structure of the phase correcting circuit 20.

FIG. 5 is a diagram showing an internal structure of the phase correcting circuit 20.

In FIG. 5, a delay variable filter 21 sequentially obtains a read sampling value which is supposed to be obtained at a time point when the phase is deviated by an amount according to a correction signal (X) from a plurality of successive read sampling values in the read sampling value sequence (R) on the basis of Nyquist's sampling theorem and outputs it as a corrected read sampling value sequence (P). A phase error detecting circuit 22 detects a phase error occurring between the corrected read sampling value sequence (P) and the clock signal supplied from the PLL circuit 10 and supplies a phase error (e) corresponding to the detected phase error to a loop filter 23. The loop filter 23 filters the phase error (e) and supplies it as a correction signal (X) to the delay variable filter 21.

By the above construction, a correction amount ($\Delta_t/T$) of the delay variable filter 21, which will be explained later, is increased or decreased in accordance with the phase error e of a corrected read sampling value sequence P which is detected by the phase error detecting circuit 22 and a feedback control is executed so that the phase error e is equal to 0, thereby correcting the phase error of the corrected read sampling value sequence P.

The principle of the operation of the delay variable filter 21 will now be described.

The method of obtaining the corrected read sampling value sequence P which is derived from the read sampling value sequence R when the sampling timing is deviated by $\Delta_t$ is well known as a sampling theorem of Nyquist. The sampling value sequence P which is obtained when the sampling timing is deviated by an arbitrary time can be calculated by the following equation based on the read sampling value sequence R.

$$P_k = \sum_{n=-\infty}^{\infty} R_{k+n} \cdot a_n \tag{1}$$

$$a_n = \mathrm{SIN}\{\pi(\Delta t/T - n)\}/\pi(\Delta t/T - n)$$

where, $P_k$, $R_k$ are the kth sampling values, and T is sampling period.

However, the sum in the case where n is infinite cannot be obtained actually. Since a coefficient $a_n$ approaches 0 as the absolute value of n increases, therefore, $a_n$ when the absolute value of n is large is approximated to be 0 and the sampling value sequence P is obtained by the following equation based on the sampling values of a finite number (2m+1, m: natural number, 1, 2, 3, . . . ).

$$P_k = \sum_{n=-m}^{m} R_{k+n} \cdot a_n \tag{2}$$

$$a_n = \mathrm{SIN}\{\pi(\Delta t/T - n)\}/\pi(\Delta t/T - n)$$

Figure 6:
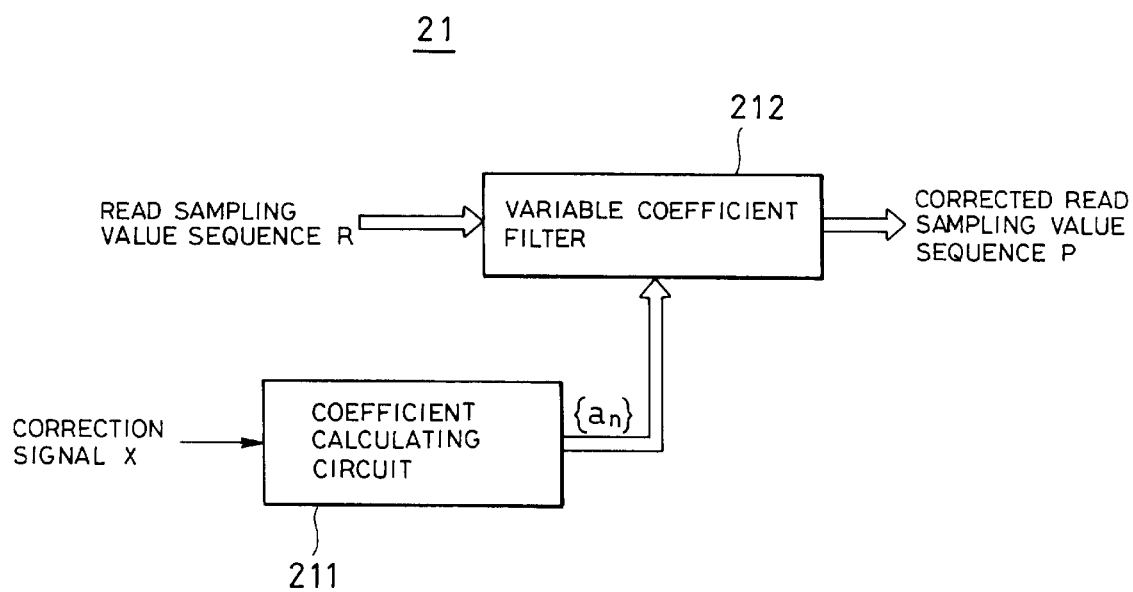
FIG. 6 is a diagram showing an example of the internal structure of a delay variable filter 21.

FIG. 6 is a diagram showing an example of an internal construction of the delay variable filter 21 to realize the above mentioned operations.

A coefficient calculating circuit 211 obtains the coefficient $a_n$ of a variable coefficient filter 212 by the following operation of:

$$a_n = \mathrm{SIN}\{\pi(-X-n)\}/\pi(-X-n) \tag{3}$$

by setting $\Delta_t/T = -X$ in the equation (2).

The variable coefficient filter 212 executes the following operation of:

$$P_k = \sum_{n=-m}^{m} R_{k+n} \cdot a_n$$

and obtains the corrected read sampling value sequence P which is obtained at a time point when the phase is shifted by an amount corresponding to the correction signal X.

When the correction signal X has a positive polarity as a result of the arithmetic operation, namely, when the read sampling value sequence R is delayed, the corrected read sampling value sequence P in which the sampling timing is advanced by $|-XT|$ $(=|\Delta_t|)$ is obtained. When the correction signal X has a negative polarity, namely, when the read sampling value sequence R is advanced, the corrected read sampling value sequence P in which the sampling timing is delayed by $|-XT|$ $(=|\Delta_t|)$ is obtained.

Although explanation has been made for a case where the equation (3) is used as it is, the equation (3) can be approximated to a linear function, when (X<<1).

The phase correcting circuit corrects a residual phase error of the ordinary PLL. The relation of (X<<1) is usually satisfied in the residual phase error of the PLL.

The coefficient $a_n$, of the variable coefficient filter 212 can be also obtained from the following arithmetic operations.

$a_n = -X/n\pi$  n=odd $a_n = X/n\pi$ n=even
$a_n = 1$ n=0
Further, when m=1 (3 taps),
$a_n = -X/\pi$ n=odd
$a_n = X/\pi$ n=even
$a_n = 1$ n=0

A construction of the variable coefficient filter 212 in this instance will be described in FIG. 8.

The variable coefficient filter 212 obtains the corrected read sampling value sequence P by the following arithmetic operation as mentioned above.

Figure 7:
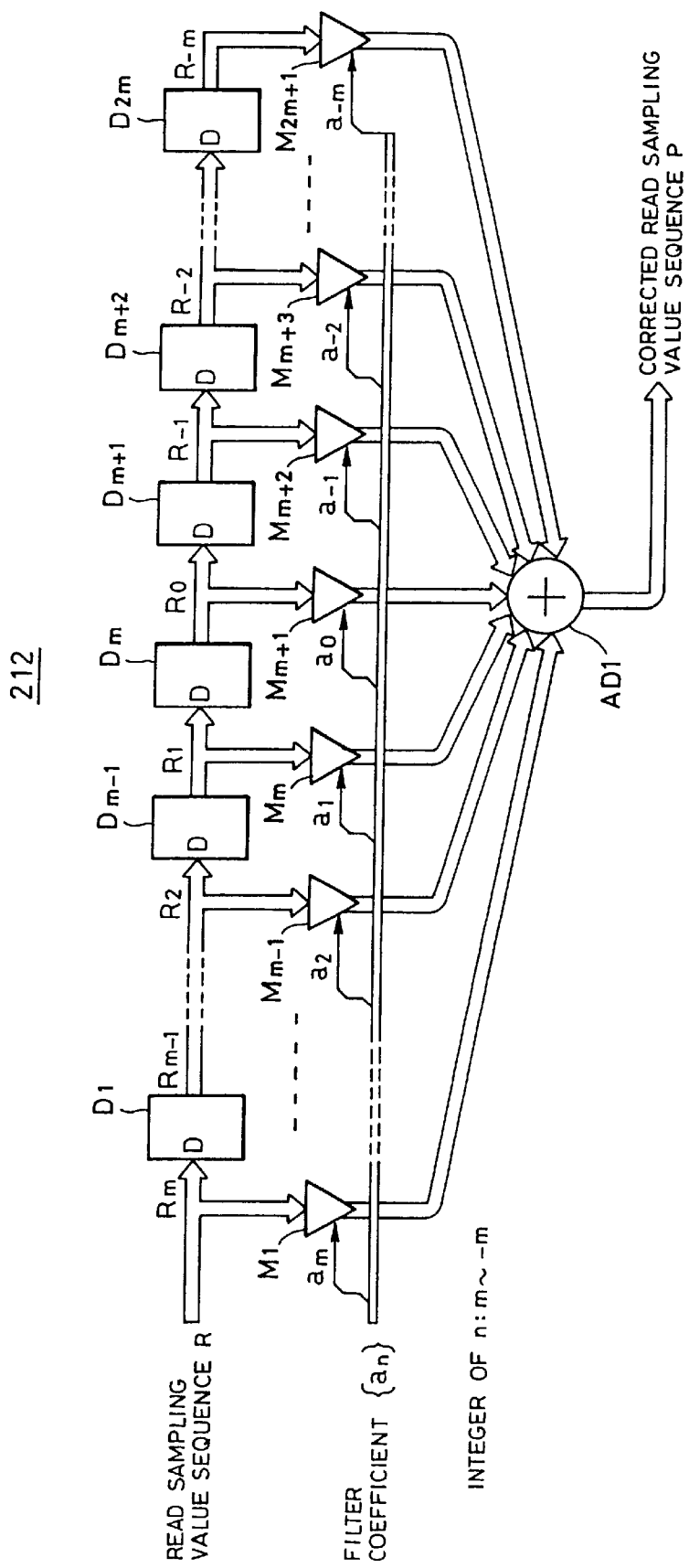
FIG. 7 is a diagram showing an internal structure of a variable coefficient filter 212 when it is formed with (2m+1) taps.

For instance, a circuit to realize the above arithmetic operation is constituted by an FIR (Finite Impulse Response) filter as shown in FIG. 7.

In FIG. 7, the read sampling value sequence R is supplied to a system comprising 2m unit delay elements $D_1$ to $D_{2m}$ which are cascade connected. Each of the unit delay elements $D_1$ to $D_{2m}$ gives a delay time that is equal to the sampling period T. An output of one unit delay element becomes an input of one sampling time before. In FIG. 7, a read sample $R_0$ generated from the unit delay element $D_m$ is captured as a read sample at time point 0 and an output of each of the unit delay elements $D_1$ to $D_2$ is shown. For example, in this instance, the unit delay element $D_{m+1}$ generates a read sampling value $R_{-1}$ at a time point which is one-sampling preceding to time point 0. The unit delay element $D_{m-1}$ generates a read sampling value $R_1$ at a time point that is one-sampling subsequent to time point 0. The unit delay element $D_{2m}$ generates a read sampling value $R_{-m}$ at a time point which is m-sampling preceding to time point 0.

The unit delay element $D_1$ generates a read sampling value $R_{m-1}$ at a time point that is (m-1)-sampling subsequent to time point 0. Therefore, a read sampling value $R_m$ at a time point which is m-sampling subsequent to time point 0 is supplied to the unit delay element $D_1$.

The read sampling values $R_m, R_{m-1}, \ldots, R_1, R_0, R_{-1}, \ldots, R_{-m}$ are supplied to coefficient multipliers $M_1$ to $M_{2m+1}$, respectively. The coefficient multipliers $M_1$ to $M_{2m+1}$ multiply the read sampling values $R_m, R_{m-1}, \ldots, R_1, R_0, R_{-1}, \ldots, R_{-m}$ by a filter coefficient $\{a_n\}$ supplied from the coefficient calculating circuit 211 and supply multiplication results to an adder AD1, respectively. The adder AD1 generates an addition result obtained by adding all of the multiplication results as a corrected read sampling value sequence P.

With the structure described above, the delay variable filter 21 obtains the corrected read sampling value sequence P which is obtained at a correct sampling time point in which the phase is deviated by the phase error time $\Delta_t$ from the continuous (2m+1) read sampling values in the read sampling value sequence R by the following interpolation arithmetic operation based on Nyquist's sampling theorem.

Figure 8:
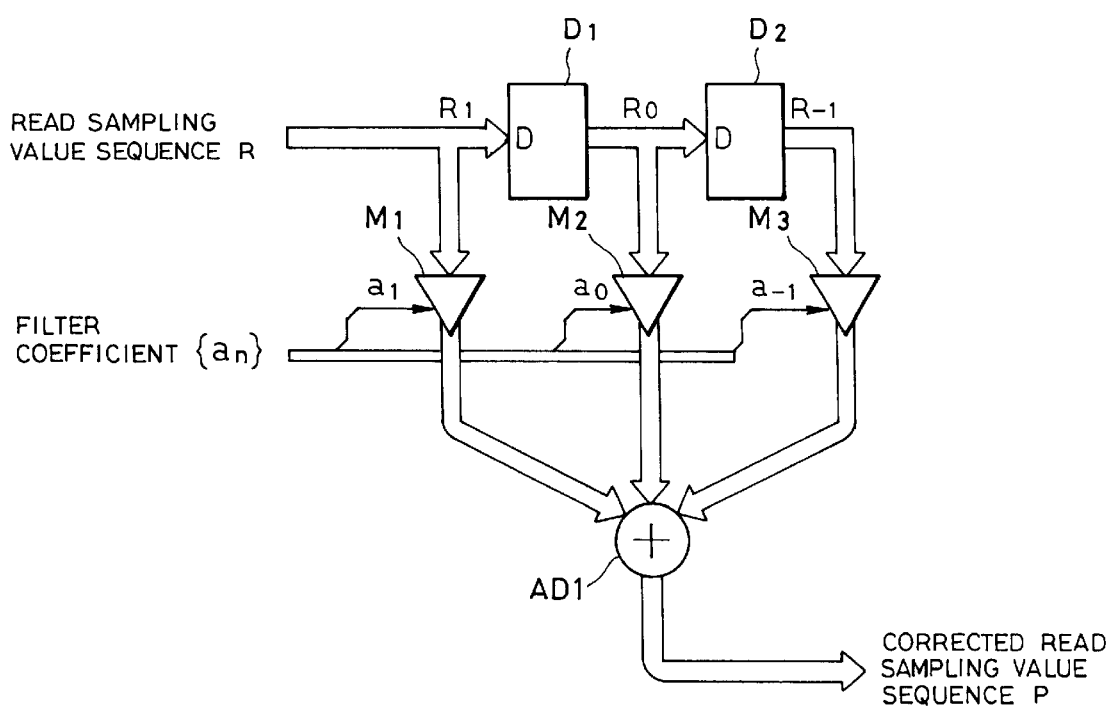
FIG. 8 is a diagram showing the internal structure of the variable coefficient filter 212 when it is formed with three taps.

FIG. 8 shows an example of a construction when the variable coefficient filter 212 shown in FIG. 7 is realized by m=1 (3 taps) as mentioned above.

In FIG. 8, each of the unit delay elements $D_1$ and $D_2$ gives a delay time which is equal to the sampling period T and an output of one unit delay element becomes an input of one-sampling time before. In FIG. 8, it is assumed that the read sample $R_0$ generated from the unit delay element $D_1$ is captured as a read sample at time point 0 and the unit delay element $D_2$ generates the read sampling value $R_{-1}$ at a time point which is one-sampling preceding to time point 0. In this instance, therefore, the read sampling value $R_1$ at a time point that is one-sampling subsequent to time point 0 is supplied to the unit delay element $D_1$. The coefficient multiplier $M_1$ multiplies the read sampling value $R_1$ by the filter coefficient $a_1$, namely, $(-X/\pi)$ and supplies an obtained multiplication result to the adder AD1. The coefficient multiplier $M_2$ multiplies the read sampling value $R_0$ by the filter coefficient $a_0$, namely, "1" and supplies an obtained multiplication result to the adder AD1. The coefficient multiplier $M_3$ multiplies the read sampling value $R_{-1}$ by the filter coefficient $a_{-1}$, namely, $(X/\pi)$ and supplies an obtained multiplication result to the adder AD1. The adder ADi adds the multiplication results which are supplied from the coefficient multipliers $M_1$ to $M_3$ and generates an obtained addition result as a corrected read sampling value sequence P.

Figure 9:
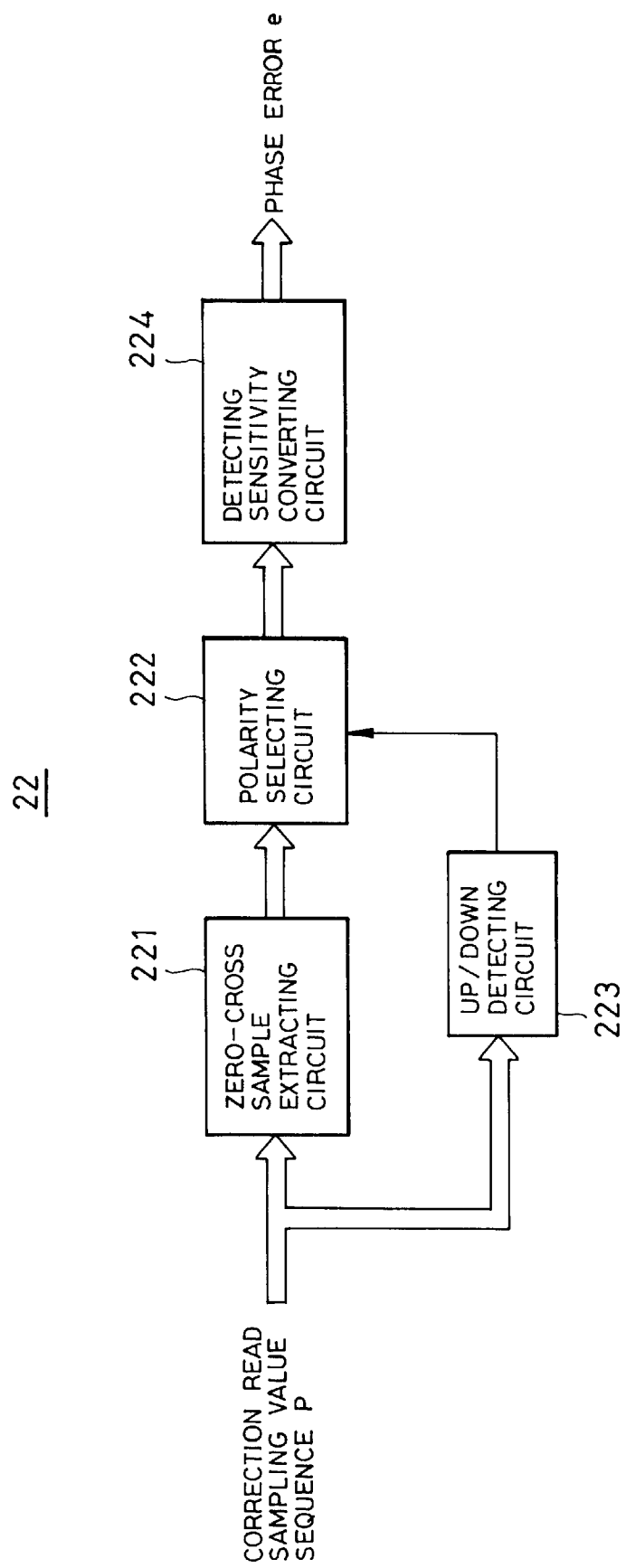
FIG. 9 is a diagram showing an example of an internal construction of a phase error detecting circuit 22.

FIG. 9 is a diagram showing an example of an internal construction of the phase error detecting circuit 22.

In FIG. 9, a zero-cross sample extracting circuit 221 extracts the sampling value that is the closest to 0 when its polarity is inverted among three successive samples in the corrected read sampling value sequence P, namely, a zero-cross sampling value at the time of zero-cross and supplies it to a polarity selecting circuit 222. An up/down detecting circuit 223 detects whether the corrected read sampling value sequence P has an ascending tendency or a descending tendency and supplies a detection result to the polarity selecting circuit 222. When it is detected by the up/down detecting circuit 223 that the corrected read sampling value sequence P has the ascending tendency, the polarity selecting circuit 222 supplies the zero-cross sampling value to a detecting sensitivity converting circuit 224 as it is. When it is detected that the corrected read sampling value sequence P has the descending tendency, the polarity selecting circuit 222 supplies the zero-cross sampling value whose polarity has been inverted to the detecting sensitivity converting circuit 224. The detecting sensitivity converting circuit 224 converts the zero-cross sampling value supplied from the polarity selecting circuit 222 to a ratio $\tau/T$ of a phase deviation for the sampling period T and generates it as a phase error e.

The operation of the phase error detecting circuit 22 having the above construction will now be described.

Since processes in the case where the corrected read sampling value sequence P has the ascending tendency and the case where it has the descending tendency are different, they will be explained divisionally with respect to each case.

When there is no phase error in the incoming corrected read sampling value sequence P, it is now assumed that the zero-cross sampling value (value of $P_0$ in FIGS. 10 to 13, which will be explained later) that is the closest to 0 when the polarity is inverted among three continuous samples is equal to "0".

First, a case where the sampling values have an ascending tendency will be described with reference to FIGS. 10 and 11.

Figure 10:
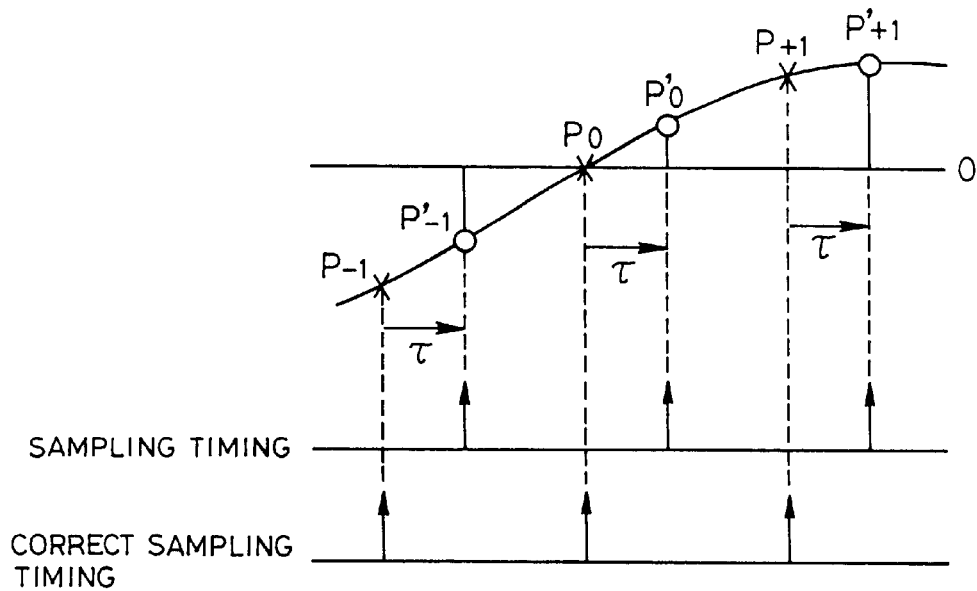
FIGS. 10 and 11 are diagrams for explaining the phase correcting operation by the phase correcting circuit 20.

As shown in FIG. 10, when the sampling timing is delayed, a sampling value $P_0'$ at the time of zero-cross has a positive polarity. As shown in FIG. 11, when the sampling timing is advanced, the sampling value $P_0'$ at the time of zero-cross has a negative polarity. Therefore, the sampling value $P_0'$ at the time of zero-cross directly indicates the phase error. In this instance, the detecting sensitivity converting circuit 224 converts the sampling value $P_0'$ into the ratio $\tau/T$ for the sampling period T and generates it as a phase error e.

Figure 11:
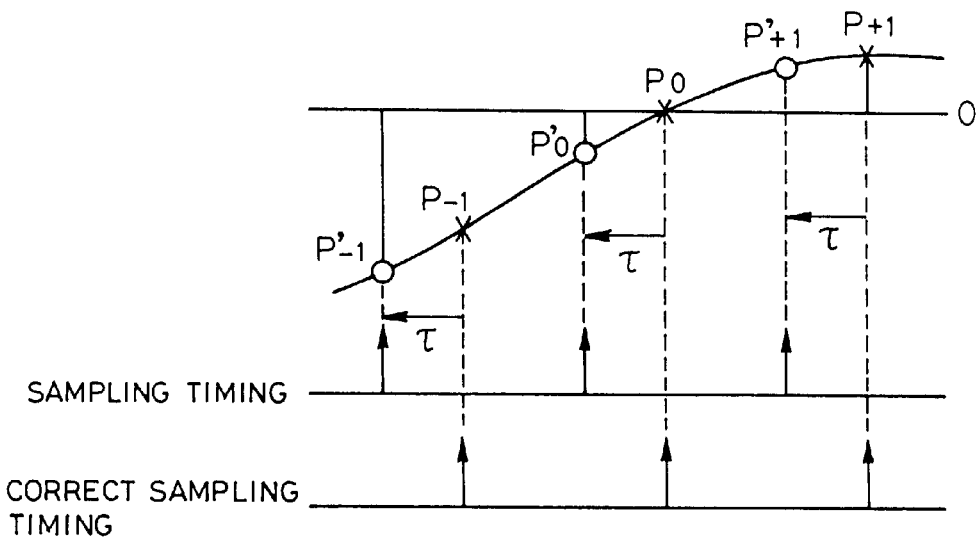
Figure 12:
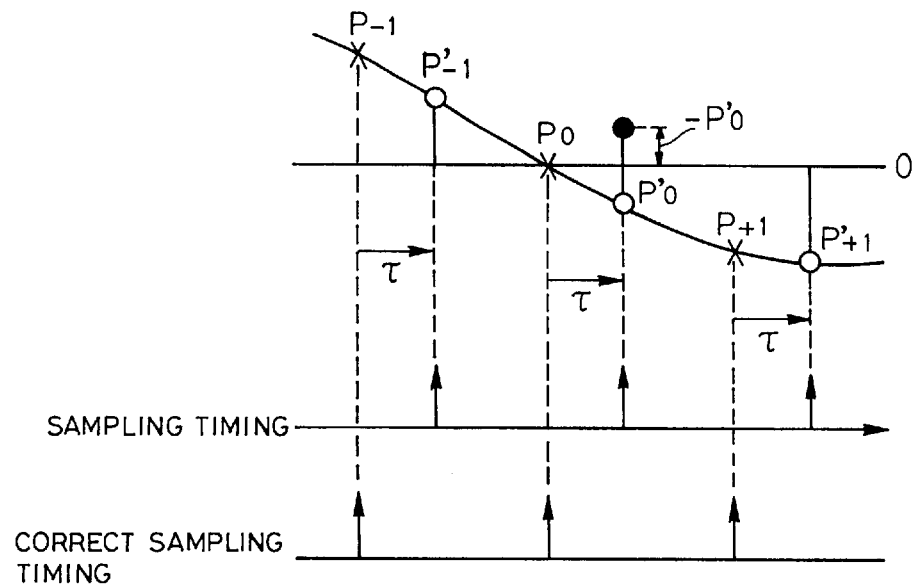
FIGS. 12 and 13 are diagrams for explaining the phase correcting operation by the phase correcting circuit 20.
Figure 13:
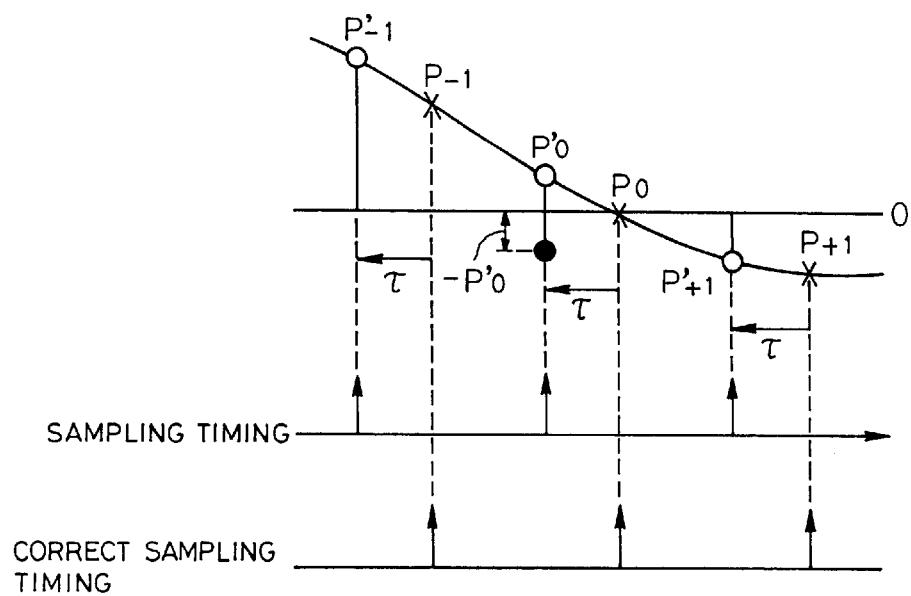

A case where the sampling values have a descending tendency as shown in FIGS. 12 and 13 will now be described. As shown in FIG. 12, when the sampling timing is delayed, the sampling value $P_0'$ at the time of zero-cross has a negative polarity. As shown in FIG. 13, when the sampling timing is advanced, the sampling value $P_0'$ at the time of zero-cross has a positive polarity. Therefore, since the polarity of the sampling value $P_0'$ at the time of zero-cross is inverted as compared with that in the case where the sampling values shown in FIGS. 10 and 11 have the ascending tendency, the phase error based on the value in which the polarity of the sampling value $P_0'$ at the time of zero-cross has been inverted is converted to the ratio $\tau/T$ for the sampling period T by the detecting sensitivity converting circuit 224 and is generated as a phase error e.

As mentioned above, the phase error e which has the positive polarity when the sampling timing is delayed and has the negative polarity when it is advanced is obtained.

By the construction as mentioned above, in the phase correcting circuit 20 shown in FIG. 4, the correction amount $\Delta_t$ of the delay variable filter 21 is increased or decreased in accordance with the phase error e of the corrected read sampling value sequence P detected by the phase error detecting circuit 22 and a feedback control is performed so that the phase error e is equal to 0, thereby correcting the phase error of the corrected read sampling value sequence P.

For example, as shown in FIGS. 10 and 12, in the case where the phase of the sampling timing of the corrected read sampling value sequence P is delayed, the polarity of the phase error e which is detected by the phase error detecting circuit 22 is positive and the correction signal X increases in accordance with it. In this instance, the correction amount $\Delta_t$ of the delay variable filter 21 changes in accordance with the correction signal X and acts so as to advance the sampling timing of the corrected read sampling value sequence P.

As shown in FIGS. 11 and 13, when the phase of the sampling timing of the corrected read sampling value sequence P is advanced, the polarity of the phase error e which is detected by the phase error detecting circuit 22 is negative and the correction signal X decreases in accordance with it. In this instance, the correction amount $\Delta_t$ of the delay variable filter 21 changes in accordance with the correction signal X and acts so as to delay the sampling timing of the corrected read sampling value sequence P.

By controlling the correction amount $\Delta_t$ of the delay variable filter 21 so that the phase error e of the corrected read sampling value sequence P is equal to 0, the residual phase error of the read sampling value sequence R is corrected.

Figure 14:
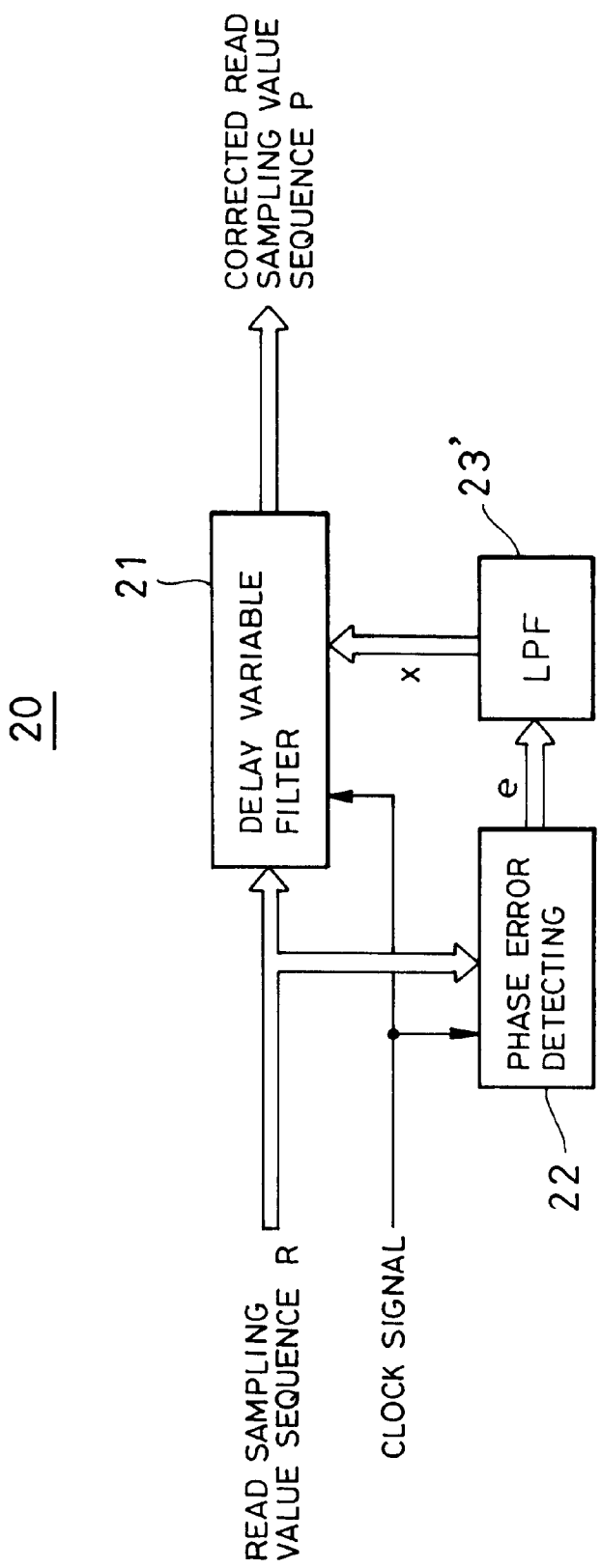
FIG. 14 is a diagram showing an internal structure of the phase correcting circuit 20 having a feedforward construction.

In the phase correcting circuit 20 shown in FIG. 5, although what is called a feedback construction such that the phase error is detected from the corrected read sampling value sequence P finally obtained and the phase correction is performed has been used, the phase correcting circuit 20 can also use a feedforward construction as shown in FIG. 14.

In a construction shown in FIG. 14, the phase error detecting circuit 22 in the phase correcting circuit 20 detects the phase error for the read sampling value sequence R supplied from the A/D converter 5 and supplies the obtained phase error e to an LPF 23'.

In case of the feedforward construction, the construction such that the correction amount of the delay variable filter 21 is controlled so that the phase error e is equal to 0 like a case of the feedback construction shown in FIG. 5 is not used but the residual phase error of the read sampling value sequence R is corrected by setting the magnitude itself of the phase error e to the correction amount $\Delta_t/T$ of the delay variable filter 21. Since it is, therefore, necessary to quantitatively accurately perform the conversion from the phase error e to the correction amount $\Delta_t/T$, the LPF 23' in FIG. 14 supplies the mean value of the phase errors e as a correction signal X to the delay variable filter 21 and its gain is equal to 1.

Figure 15:
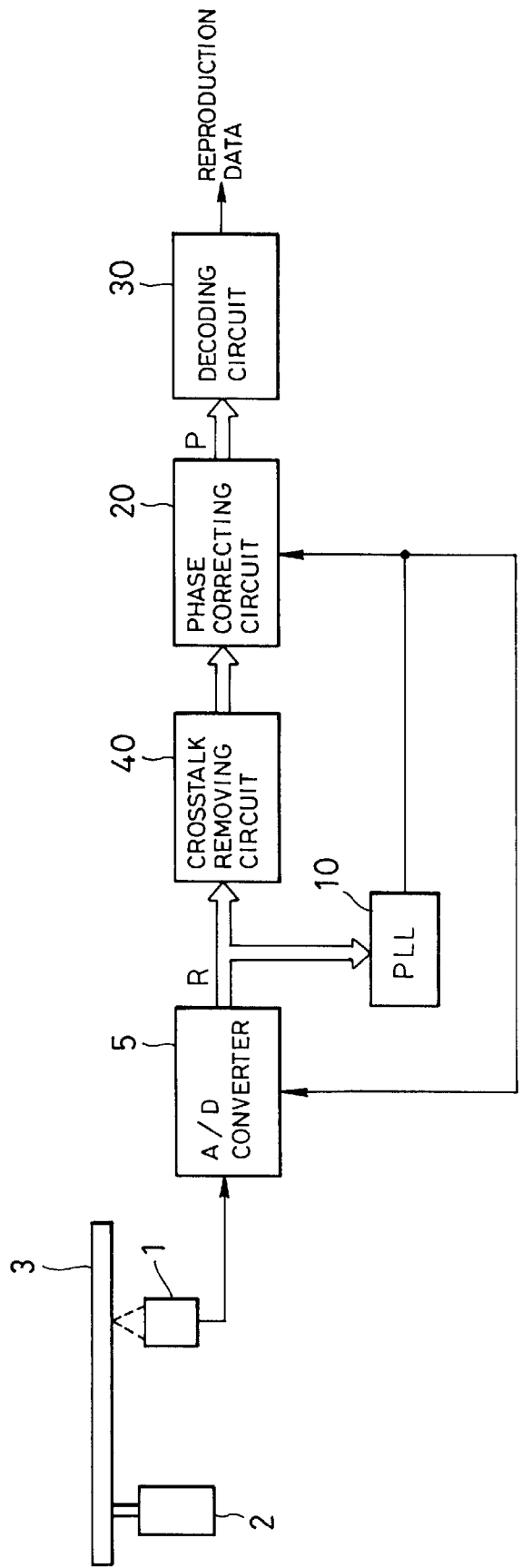
FIG. 15 is a diagram showing the structure of a recording information reproducing apparatus to which a crosstalk removing circuit is added.

As shown in FIG. 15, a crosstalk removing circuit 40 to remove the crosstalk from the adjacent track which has been multiplexed into the read sampling value sequence R can be also provided at the front stage of the phase correcting circuit 20. At this time, since the phase correcting circuit 20 executes the phase correction to the read sampling value sequence after the removal of the crosstalk, the phase correction of higher reliability can be performed.

According to the recording information reproducing apparatus of the invention as mentioned above, even if the PLL circuit 10 cannot follow the time base fluctuation due to the influence by a rotation fluctuation of the spindle motor 2, an eccentricity of the recording disc 3 itself, or the like, the residual phase error caused by the time base fluctuation is reduced by the phase correcting circuit 20. Furthermore, according to the structure described above, the servo band of the PLL circuit 10 can be narrowed. This means that the reproduction system can be made less susceptible to influences by a scratch on the disc recording medium surface and a crosstalk at the time of reading of information by narrowing the servo band.

What is claimed is:

1. A recording information reproducing apparatus for reproducing information data corresponding to recording information recorded on a recording medium on the basis of a read signal read out from said recording medium, comprising:
   a PLL circuit for generating an oscillation signal whose phase is synchronized with that of a read sampling value sequence obtained by sampling said read signal at a timing according to a clock signal and using said oscillation signal as said clock signal;
   phase correcting means for obtaining a sampling value sequence derived at a time point when the phase in said read sampling value sequence is deviated by an amount corresponding to a phase error which occurs in said read sampling value sequence and setting said sampling value sequence to a corrected read sampling value sequence; and
   decoding means for executing a decoding process to said corrected read sampling value sequence, thereby obtaining said information data,
   wherein said phase correcting means comprises:
      phase error detecting means for detecting a phase error between said corrected read sampling value sequence and said clock signal;
      a loop filter for obtaining a correction signal by filtering said phase error; and
      a delay variable filter for obtaining a sampling value sequence which is derived at a time point when the phase is deviated by a time corresponding to said correction signal on the basis of said read sampling value sequence and setting said sampling value sequence to said corrected read sampling value sequence.

2. An apparatus according to claim 1, wherein said delay variable filter obtains said corrected read sampling value sequence from said read sampling value sequence by an interpolation arithmetic operation based on a sampling theorem.

3. An apparatus according to claim 1, wherein said delay variable filter is an FIR filter for performing a filtering process by a filter coefficient based on said correction signal, a filter coefficient $a_{n(even)}$ corresponding to even number (not including 0) designated coefficient taps among the nth coefficient taps of said FIR filter is:
   $a_{n(even)} = \alpha \cdot X/n$ where, $\alpha$ is a proportional constant, and X is said correction signal, a filter coefficient an(odd) corresponding to odd number designated coefficient taps among the nth coefficient taps of said FIR filter is:

$a_{n(odd)} = -\alpha \cdot X/n$ where, $\alpha$ is a proportional constant; and X is said correction signal, and a filter coefficient $a_0$ corresponding to the 0th coefficient tap of said FIR filter is:

$a_0 = 1$.

4. An apparatus according to claim 3, wherein the number of coefficient taps of said FIR filter is equal to 3 and filter coefficients $a_{-1}$, $a_0$, and $a_1$ corresponding to each of said coefficient taps are:

$a_{-1} = \alpha \cdot X$ $a_0 = 1$ $a_1 = -\alpha \cdot X$ where, $\alpha$ is a proportional constant, and X is said correction signal.

5. A recording information reproducing apparatus for reproducing information data corresponding to recording information recorded on a recording medium on the basis of a read signal read out from recording tracks formed on said recording medium, comprising:

a PLL circuit for generating an oscillation signal whose phase is synchronized with that of a read sampling value sequence obtained by sampling said read signal at a timing according to a clock signal and setting said oscillation signal to said clock signal;

a crosstalk removing circuit for obtaining a crosstalk removal read sampling value sequence in which crosstalk components from adjacent tracks have been removed from said read sampling value sequence;

phase correcting means for obtaining a sampling value sequence derived at a time point when the phase in said crosstalk removal read sampling value sequence is deviated by an amount corresponding to a phase error which occurs in said crosstalk removal read sampling value sequence and setting said sampling value sequence to a corrected read sampling value sequence; and decoding means for executing a decoding process to said corrected read sampling value sequence, thereby obtaining said information data.

6. An apparatus according to claim 5, wherein said phase correcting means comprises:

phase error detecting means for detecting a phase error between said corrected read sampling value sequence and said clock signal;

a loop filter for obtaining a correction signal by filtering said phase error; and a delay variable filter for obtaining a sampling value sequence which is derived at a time point when the phase is deviated by a time corresponding to said correction signal on the basis of said crosstalk removal read sampling value sequence and setting said sampling value sequence to said corrected read sampling value sequence.

7. An apparatus according to claim 6, wherein said delay variable filter obtains said corrected read sampling value sequence from said crosstalk removal read sampling value sequence by an interpolation arithmetic operation based on a sampling theorem.

8. An apparatus according to claim 6, wherein said delay variable filter is an FIR filter for performing a filtering process by a filter coefficient based on said correction signal, a filter coefficient $a_{n(even)}$ corresponding to even number (not including 0) designated coefficient taps among the nth coefficient taps of said FIR filter is:

$a_{n(even)} = \alpha \cdot X/n$ where, $\alpha$ is a proportional constant, and X is said correction signal, a filter coefficient $a_{n(odd)}$ corresponding to odd number designated coefficient taps among the nth coefficient taps of said FIR filter is $a_{n(odd)} = -\alpha \cdot X/n$ where, $\alpha$ is a proportional constant, and X is said correction signal, and a filter coefficient $a_0$ corresponding to the 0th coefficient tap of said FIR filter is:

$a_0 = 1$.

9. An apparatus according to claim 8, wherein the number of coefficient taps of said FIR filter is equal to 3 and filter coefficients $a_{-1}$, $a_0$, and $a_1$ corresponding to each of said coefficient taps are:

$a_{-1} = \alpha \cdot X$ $a_0 = 1$ $a_1 = -\alpha \cdot X$ where, $\alpha$ is a proportional constant, and X is said correction signal.

10. An apparatus according to claim 5, wherein said phase correcting means comprises:

phase error detecting means for detecting a phase error between said crosstalk removal read sampling value sequence and said clock signal;

a low pass filter for obtaining a correction signal by averaging said phase errors; and a delay variable filter for obtaining a sampling value sequence which is derived from said crosstalk removal read sampling value sequence at a time point when the phase is deviated by a time corresponding to said correction signal and setting said sampling value sequence to said corrected read sampling value sequence.

11. An apparatus according to claim 10, wherein said delay variable filter obtains said corrected read sampling value sequence from said crosstalk removal read sampling value sequence by an interpolation arithmetic operation based on a sampling theorem.

12. An apparatus according to claim 10, wherein said delay variable filter is an FIR filter for performing a filtering process by a filter coefficient based on said correction signal, a filter coefficient $a_{n(even)}$ corresponding to even number (not including 0) designated coefficient taps among the nth coefficient taps of said FIR filter is:

$a_{n(even)} = \alpha \cdot X/n$ where, $\alpha$ is a proportional constant, and X is said correction signal a filter coefficient $a_{n(odd)}$ corresponding to odd number designated coefficient taps among the nth coefficient taps of said FIR filter is $a_{n(odd)} = -\alpha \cdot X/n$ where, $\alpha$ is a proportional constant, and X is said correction signal, and a filter coefficient $a_0$ corresponding to the 0th coefficient tap of said FIR filter is:

$a_0 = 1$.

13. An apparatus according to claim 12, wherein the number of coefficient taps of said FIR filter is equal to 3 and filter coefficients $a_{-1}$, $a_0$, and $a_1$ corresponding to each of said coefficient taps are:

$a_{-1} = \alpha \cdot X$ $a_0 = 1$ $a_1 = -\alpha \cdot X$ where, $\alpha$ is a proportional constant, and X is said correction signal.

* * * * *